(12) United States Patent
Ferguson (10) Patent No.: US 10,996,248 B2
(45) Date of Patent: *May 4, 2021

(54) SYSTEM AND METHOD OF IDENTIFYING PATH OF RESIDUAL CURRENT FLOW THROUGH AN INTELLIGENT POWER STRIP

(71) Applicant: Vertiv Corporation, Columbus, OH (US)

(72) Inventor: Kevin R. Ferguson, Dublin, OH (US)

(73) Assignee: Vertiv Corporation, Columbus, OH (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/869,205

(22) Filed: May 7, 2020

(65) Prior Publication Data

US 2020/0400728 A1 Dec. 24, 2020

Related U.S. Application Data (63) Continuation of application No. 15/863,519, filed on Jan. 5, 2018, now Pat. No. 10,677,823.

(Continued)

(51) Int. Cl.
*G01R 31/42* (2006.01)
*G01R 31/50* (2020.01)
(Continued)

(52) U.S. Cl.
CPC ......... *G01R 19/2513* (2013.01); *G01R 19/02* (2013.01); *G01R 19/2509* (2013.01);
(Continued)

(58) Field of Classification Search
CPC .......... G01R 19/02; G01R 19/2509; G01R 19/2513; G01R 21/133; G01R 31/42;
(Continued)

(56) References Cited

U.S. PATENT DOCUMENTS

| | | | |
|---|---|---|---|
| 4,626,698 A | 12/1986 | Harnden, Jr. et al. | |
| 4,864,157 A | 9/1989 | Dickey | |

(Continued)

FOREIGN PATENT DOCUMENTS

| | | |
|---|---|---|
| CN | 103155327 A | 6/2013 |
| CN | 103683221 A | 3/2014 |

(Continued)

OTHER PUBLICATIONS

International Search Report and Written Opinion for International Application No. PCT/US2018/012615, dated May 14, 2018, 12 pages.

*Primary Examiner* — Mohamed Charioui
(74) *Attorney, Agent, or Firm* — Harness, Dickey & Pierce, P.L.C.

(57) ABSTRACT

A system and method is disclosed for detecting a specific voltage phase, from a multiphase voltage source, and a specific outlet of an intelligent power strip, that is associated with a residual current flow. The method accomplishes this by using a system that employs a statistical time series analysis using a Pearson's correlation coefficient calculation to measure the linear dependence between the discretely sampled residual current waveform and each phase and outlet's discretely sampled current waveforms, in turn. A residual current as low as 1 mA can be accurately measured and its associated voltage phase source, as well as which outlet of an intelligent power strip it flows out of, can be reliably determined.

16 Claims, 7 Drawing Sheets

Related U.S. Application Data (60) Provisional application No. 62/443,308, filed on Jan. 6, 2017.

(51) Int. Cl.
　　　*G01R 31/52*　　　(2020.01)
　　　*G01R 19/02*　　　(2006.01)
　　　*G01R 19/25*　　　(2006.01)
　　　*H02H 3/16*　　　(2006.01)
　　　*H02H 3/32*　　　(2006.01)
　　　*H02H 3/04*　　　(2006.01)
　　　*G06F 1/26*　　　(2006.01)
　　　*G01R 21/133*　　(2006.01)

(52) U.S. Cl.
　　　CPC ............. *G01R 31/42* (2013.01); *G01R 31/50* (2020.01); *G06F 1/266* (2013.01); *H02H 3/042* (2013.01); *H02H 3/16* (2013.01); *H02H 3/32* (2013.01); *G01R 21/133* (2013.01); *G06F 2200/261* (2013.01)

(58) Field of Classification Search
　　　CPC . G01R 31/50; H02H 3/16; H02H 3/32; H02H 3/042; G06F 1/266; G06F 2200/261
　　　See application file for complete search history.

(56) References Cited

U.S. PATENT DOCUMENTS

| | | | |
|---|---|---|---|
| 5,267,120 | A | 11/1993 | Graff et al. |
| 5,361,184 | A | 11/1994 | El-Sharkawi et al. |
| 5,533,360 | A | 7/1996 | Szynal et al. |
| 5,804,991 | A | 9/1998 | Hu |
| 5,821,642 | A | 10/1998 | Nishhira et al. |
| 5,838,077 | A | 11/1998 | Chelcun et al. |
| 6,232,675 | B1 | 5/2001 | Small |
| 6,233,132 | B1 | 5/2001 | Jenski |
| 6,768,615 | B2 | 7/2004 | Liu |
| 6,903,554 | B2 | 6/2005 | Wilson et al. |
| 7,227,732 | B2 | 6/2007 | Wang |
| 7,795,759 | B2 | 9/2010 | DuBose et al. |
| 7,957,117 | B2 | 6/2011 | Divan |
| 8,154,841 | B2 | 4/2012 | Allen et al. |
| 8,305,737 | B2 | 11/2012 | Ewing et al. |
| 8,519,745 | B2 | 8/2013 | Scholder |
| 8,559,154 | B2 | 10/2013 | Li et al. |
| 8,639,459 | B1 | 1/2014 | Morales et al. |
| 8,675,325 | B2 | 3/2014 | Beierschmitt et al. |
| 8,737,030 | B2 | 5/2014 | Valdes |
| 9,122,466 | B1 | 9/2015 | Kellett et al. |
| 2007/0291430 | A1 | 12/2007 | Spitaels et al. |
| 2008/0082277 | A1* | 4/2008 | Holmquist ............ G05B 11/28 702/64 |
| 2011/0072289 | A1* | 3/2011 | Kato ..................... G06F 1/26 713/324 |
| 2011/0102052 | A1 | 5/2011 | Billingsley et al. |
| 2013/0191103 | A1* | 7/2013 | Chu ..................... G06F 30/367 703/14 |
| 2013/0258538 | A1 | 10/2013 | Billingsley et al. |
| 2013/0286528 | A1 | 10/2013 | Murfett et al. |
| 2014/0218008 | A1 | 8/2014 | Ewing et al. |
| 2014/0268474 | A1 | 9/2014 | Steiner et al. |
| 2015/0012145 | A1 | 1/2015 | Kiko |
| 2015/0055272 | A1 | 2/2015 | Creighton et al. |
| 2016/0315465 | A1 | 10/2016 | Ferguson |
| 2016/0327595 | A1 | 11/2016 | Reinders et al. |

FOREIGN PATENT DOCUMENTS

| | | |
|---|---|---|
| JP | 2007215367 A | 8/2007 |
| JP | 2009134564 A | 6/2009 |
| JP | 2010252425 | 11/2010 |
| WO | WO-1999000811 A1 | 1/1999 |

\* cited by examiner

SYSTEM AND METHOD OF IDENTIFYING PATH OF RESIDUAL CURRENT FLOW THROUGH AN INTELLIGENT POWER STRIP

CROSS-REFERENCE TO RELATED APPLICATIONS

This application is a continuation and claims priority from U.S. application Ser. No. 15/863,519, filed on Jan. 5, 2018 (now allowed); which claims the benefit of U.S. Provisional Application No. 62/443,308, filed on Jan. 6, 2017. The entire disclosures of each of the above applications is incorporated herein by reference.

FIELD

The present disclosure relates to a system and method of identifying a path of residual current through an Intelligent Power Strip (IPS).

BACKGROUND

The statements in this section merely provide background information related to the present disclosure and may not constitute prior art.

Residual currents caused by the failure of insulation can constitute a significant risk to safety in electrical systems. Using an appropriate protective concept it is possible to detect residual currents, discover/eliminate insulation faults quickly, and therefore ensure the availability of the system.

The acronym "RCM" stands for "Residual Current Monitoring" and means the monitoring of residual currents in electrical systems. While the current sensors in the electrical systems referred to herein are AC current sensors, if different current sensor types or configurations are used, DC components could also be accurately measured using the same monitoring method. The residual current is calculated as the non-zero sum of the currents flowing through all current-carrying conductors, apart from the protective earth (PE), which feed into the electrical system. Residual currents are typically the result of insulation faults or electromagnetic compatibility (EMC) filter component faults in a power supply, for example. While RCD devices (residual current circuit breakers) switch off the power supply in the event of a certain residual current being exceeded, RCM measuring devices indicate the actual value, record the long-term development and report when the measured value exceeds a critical value. This information can also be used in order to switch off the power supply via external switching devices (contactors, relays). Through the use of residual current measuring (RCM) devices, it is possible to detect and report residual currents in a timely manner. This makes it possible to initiate counter measures within a sufficiently short time so that it is not necessary to switch the system off. This facilitates the implementation of measures in the event of slowly deteriorating insulation values or steadily rising residual currents—caused for example by aging insulation—before the system is switched off.

A power strip, often referred to as a "power distribution unit" ("PDU"), is typically used in a data center environment, with one or more units installed in racks arranged in rows, to power Internet Technology equipment (ITE). A single PDU may provide power to dozens of devices per rack via outlet sockets, and an "intelligent" power strip or rack PDU employed in a data center can measure and control the loads. A powered device, e.g., server or network switch, has one or more internal switched mode power supplies that on occasion may fail prematurely for various reasons, e.g., exposure to excessively high-temperature which can degrade electronic component lifetime. Also, the integrity of the TNS (Terra Neutral Separate) earthing systems may become inadvertently disconnected or fail. These failures may develop suddenly or gradually over time. The failure mode may result from compromised or complete breakdown of conductor or component insulation spacings, resulting in a lower impedance conduction path between line voltages of the device's power supply to protective earth ground. While the residual current that flows through the protective earth ground is not of sufficient magnitude to trip the unit's branch overcurrent protection device, only 30 mA can become a safety hazard to anyone touching the chassis. While it is critical to identify and provide an alert when a condition of excessive ground residual current develops, it is also important that the offending device can be quickly isolated and removed from the power distribution to maintain high-availability of other systems components.

One particular known technique for measuring residual current involves using a sensitive current transformer to detect and/or measure the residual current or current that does not flow back on the return path through an intelligent power strip. Although this method is able to detect that a residual current condition exists, it is unable to identify which one of a plurality of voltages of a multiphase voltage supply is sourcing the residual current condition, as well as which specific AC outlet of the PDU is associated with the residual current condition.

SUMMARY

This section provides a general summary of the disclosure, and is not a comprehensive disclosure of its full scope or all its features.

In one aspect the present disclosure relates to a method for detecting a residual current flowing through an intelligent power strip having at least one alternating current (AC) power outlet. The method may comprise obtaining current sensing information and performing an analog-to-digital (ADC) conversion of the current sensing information to obtain ADC samples. The method may further include managing a time series collection of the ADC samples as residual and outlet current waveform samples, and then calculating residual current (RC) RMS values for the obtained residual current samples. The method may further include calculating phase current from the aggregation of the outlet current waveform samples having the same phase, and then calculating Pearson's correlation coefficients for variables relating to residual current and the phase current waveforms. The method may further include calculating Pearson's correlation coefficients for the variables relating to residual current and individual outlet currents waveforms from each AC power outlet, and calculating the phase having a maximum positive Pearson's correlation when the residual current RMS is greater than a predetermined residual current RMS threshold. Finally the method may include determining an individual one of the AC power outlets having the maximum Pearson's correlation when the residual is greater than the predetermined RC threshold.

Further areas of applicability will become apparent from the description provided herein. The description and specific examples in this summary are intended for purposes of illustration only and are not intended to limit the scope of the present disclosure.

BRIEF DESCRIPTION OF THE DRAWINGS

The drawing described herein is for illustration purposes only and is not intended to limit the scope of the present disclosure in any way. In the drawing figures:

FIG. 4A1, 4A2, 4A3 is a detailed flowchart illustrating operations performed by the apparatus of FIG. 1 in detecting a residual current condition, as well as a specific voltage phase.

DETAILED DESCRIPTION

The following description is merely exemplary in nature and is not intended to limit the present disclosure, application, or uses. It should be understood that throughout the drawings, corresponding reference numerals indicate like or corresponding parts and features.

Figure 1:
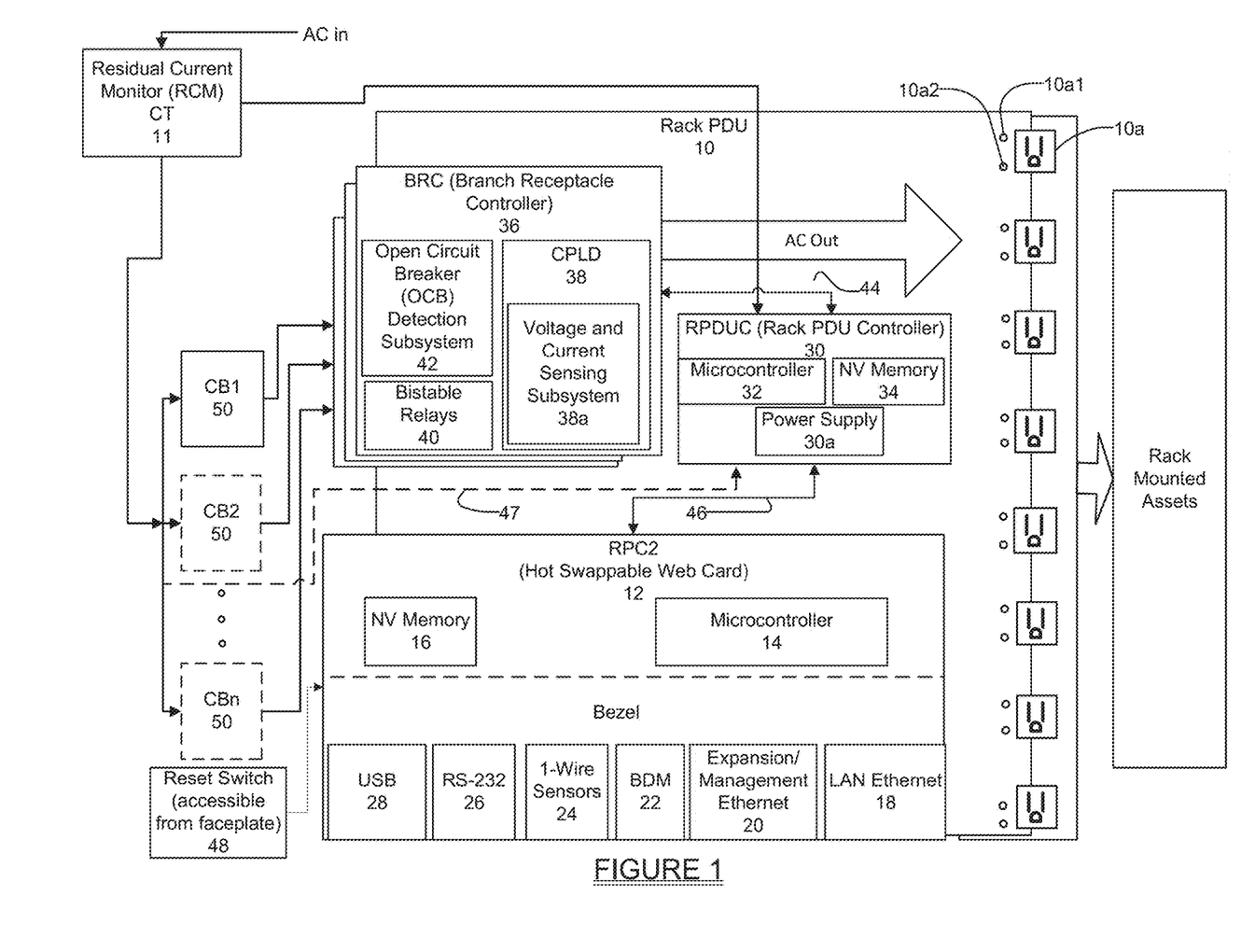
FIG. 1 is a high level block diagram of one embodiment of an apparatus in accordance with one embodiment of the present disclosure.

Referring to FIG. 1, one embodiment of an apparatus 10 is shown which forms an intelligent equipment rack power distribution unit able to monitor for residual current associated with any one or more of a plurality of rack mounted assets being powered by the apparatus 10. For convenience, the apparatus 10 will be referred to throughout simply as "PDU 10".

The PDU 10 may incorporate a residual current monitor current transformer 11, hereinafter simply "RCMCT 11", which is operatively coupled to three-phase AC power from some upstream device (e.g., AC mains source, UPS, etc.) and which senses a residual current condition affecting any one or more of a plurality of AC outlets 10a of the PDU. The operation of the RCMCT 11 and its connections to other components of the PDU 10 will be described in greater detail in the following paragraphs.

The PDU 10 in this example may also incorporate a communications module RPC2 12 (hereinafter simply "RPC 12"), which may be a hot-swappable web card which is installed in the PDU 10, and in this example may be the RPC2™ Network Interface Card available from Vertiv Co., assignee of the present disclosure. The RPC 12 may include a microcontroller 14 and preferably also a non-volatile (NV) memory 16. The RPC 12 may also include a plurality of ports including, but not limited to, a LAN Ethernet port 18, an Expansion/Management port 20, a port 22 for coupling to a display module (e.g., "BDM" or "Basic Display Module" available from the assignee of the present disclosure), one or more 1-wire sensor ports 24, an RS-232 port 26 and a USB port 28.

The PDU 10 further may include a Rack PDU Controller (RPDUC) 30 having a microcontroller 32 and a non-volatile memory 34, and one or more branch receptacle controllers (BRC) 36. The RPDUC 30 receives current information from the RCMCT 11. Each BRC 36 may have a complex programmable logic device (CPLD) 38 having a voltage and current sensing subsystem 38a which senses a loss of AC input power, a plurality of bistable relays 40, and an open circuit breaker (OCB) detection subsystem 42 which senses for an open circuit breaker condition. The RPDUC 30 is in bidirectional communication with each of the BRCs 36 via a bus 44. The RPC 12 is in bidirectional communication with the RPDUC 30 via a bus 46. A reset switch 48, which is easily accessible by a user via a faceplate of the PDU 10, is provided for enabling the user to initiate a hard reset of the PDU.

FIG. 1 also shows a plurality of branch circuit breakers (CB) 50 that each receives AC input power directly from the current-carrying conductors passing through the RCMCT 11. By "branch" circuit breaker it is meant that each one of the CBs 50 is typically associated with one specific BRC 36. The OCB detection subsystem 42 monitors the CBs 50 to detect when any one or more have been tripped to an open condition. And as explained above, each BRC 36 includes a plurality of bistable relays 40, which in one specific embodiment comprise eight (8) bistable relays. However, it will be appreciated that a greater or lesser number of bistable relays 40 could be provided per branch. Mechanical bistable relays have coils and mechanical contacts. They can be single coil or dual coil relays. Also, more than one CB 50 may exist for each BRC 36. For example, each BRC 36 can have its bistable relays arranged in two sub banks, with a separate CB 50 associated with each sub-bank. As used herein, each sub-bank of a BRC 36 is a branch of the BRC.

FIG. 1 also shows the plurality of AC power outlets 10a. In this example, each outlet is single-phase in line-neutral or line-line configuration, with its associated phase established at manufacturing time and saved in NV memory 16. Each outlet has a first associated optical element 10a1 and a second optical element 10a2. Optical elements 10a1 may each be an LED having a first color, for example green, that indicates a status of the specific bistable relay 40 associated with its specific AC outlet 10a. The second group of optical elements 10a2 may also be, for example, LEDs having a different color, for example red, for providing additional information to the user. Each one of the green LEDs 10a1 may indicate, for example, that the bistable relay 40 associated with that specific AC outlet 10a is closed, and an extinguished green LED 10a1 would therefore indicate that the associated bistable relay is open. Each AC power outlet 10a may be used to power an associated rack mounted asset (e.g., server, network switch, etc.)

Figure 2:
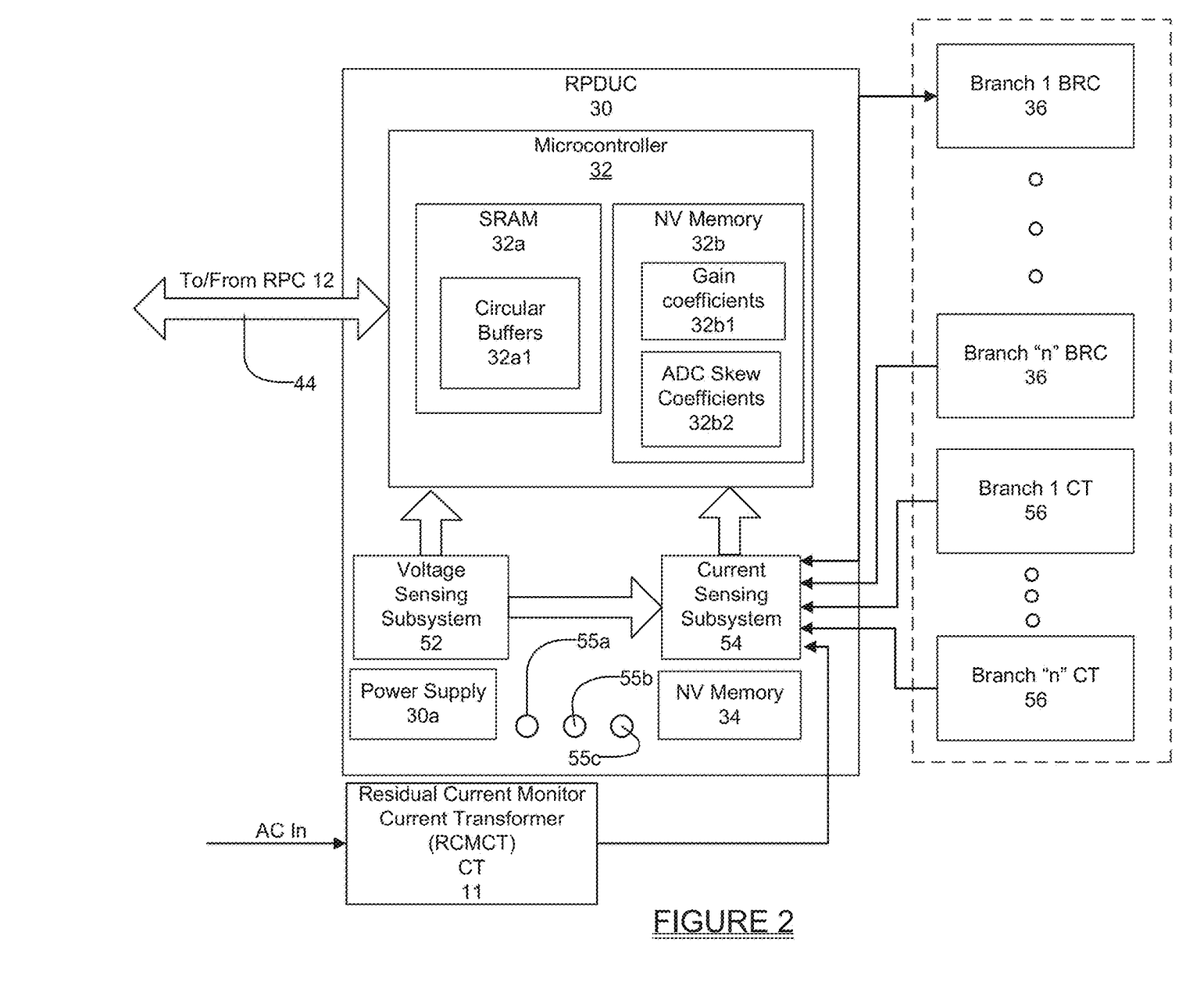
FIG. 2 is a high level block diagram showing in greater detail various components that may be incorporated into the microcontroller shown in FIG. 1.

The RPDUC 30 is shown in greater detail in FIG. 2. The microcontroller 32 of the RPDUC 30 may include a static random access memory 32a (hereinafter simply "SRAM 32a") and a non-volatile read only memory or non-volatile random access memory 32b (hereinafter simply "NV memory 32b"). The SRAM 32a may contain a plurality of circular buffers 32a1 to hold current waveform data samples, while the NV memory 32b may be used to store gain coefficients 32b1 and ADC skew coefficients 32b2. The use of the circular buffers 32a1, the gain coefficients 32b1 and the ADC coefficients 32b2 will be discussed further in the following paragraphs. And while the SRAM 32a and NV memory 32b in this example are shown as part of the microcontroller 32, it will be appreciated that they could be implemented as independent memory devices just as well.

The RPDUC 30 includes a voltage sensing subsystem 52 and a current sensing subsystem 54. The subsystems 52 and 54 perform real time RMS voltage measurements and RMS current measurements, respectively, and thus monitor the power input from the AC power source. The RCMCT 11 is also in communication with the current sensing subsystem 54. Three phase LEDs 55a-55c may be incorporated and/or operatively coupled to the RPDUC 30 that indicate the voltage and current conditions of each phase of the AC input, including the residual current condition. The monitored power information may be shared with the RPC 12 via bus 44. As noted above, the voltage and current sensing subsystem 38a of each BRC 36 also monitors for a loss of AC input power, so in this regard there is redundancy of this feature in the RPDUC 30 and the BRCs 36. The current sensing subsystem 54 of the RPDUC 30 receives an input current signal from each of the branch BRCs (collectively labeled for simplicity in FIG. 2 with number 36) which it uses to perform its current sensing function. Each branch BRC 36 also includes a plurality of current transformers (CTs) 56 for independently measuring a current being drawn by the AC outlets 10a associated with each branch of bistable relays 40. The signals from each branch CT 56 are input to the current sensing subsystem 54 for analysis.

The RPC 12 shown in FIG. 1 manages, monitors and reports information about PDU 10 energy metering and power distribution status obtained from the RPDUC 30 to networked software clients. The RPDUC 30 provides support for the energy metering measurements and calculations, control management, and communications interfaces to the RPC 12, as described above. The RPDUC 30 communicates with each BRC 36 and, except upon power loss, controls the bistable relays 40 of each BRC by sending command messages to each BRC to independently control each one of its associated bistable relays 40.

The BRC 36, and more particularly its CPLD 38, directly controls its bistable relays 40. The BRC 36 also manages individual LED outlet operational status, and detects loss of an AC input power signal via line frequency monitoring performed by the voltage sensing portion of the voltage and current sensing subsystem 38a, as well as using the OCB subsystem 42 to detect for an open circuit breaker condition. The bistable relays 40 of each BRC 36 in this example require a nominal 16 msec pulse to their coils to change states, that is, to open or close their contacts. A reference herein to a bistable relay being "open" means that its contacts are open and power is off or interrupted at the outlet 10a to which the bistable relay switches power. As used herein, "power up", "power down", "power failure", and "power cycle" refer to specific conditions of input AC line voltage, which is the AC power provided to the outlets 10a through the bistable relays 40 of each BRC 36. The term "Configured state", when used in connection with the bistable relays 40, means the state that a given bistable relay is configured to be in (i.e., open or closed) when power is on. For the purpose of the present disclosure, it may be understood that the term "configured state" means that the bistable relays 40 will, after the PDU 10 is powered up, have closed contacts in order to switch power on at the AC outlets 10a."

The RPC 12 commands the RPDUC 30 via a SMBus (I2C) communication bus, bus 46 in FIG. 1 in this example, which in turn, commands the BRC 36 via a SPI communication bus, which is bus 44 in this example, to configure the relay state of each bistable relay 40. The RPDUC 30 is capable of autonomous behavior without RPC 12 commands. The one or more BRCs 36 are each capable of autonomous behavior without RPDUC 30 commands.

The PDU 10 and its method of operation significantly extend the ability of traditional systems and methods for measuring residual current by incorporating statistical analysis. The statistical analysis is used to infer which voltage phase of the AC input voltage is affected by the path of a residual current. If the PDU 10 is equipped with dedicated current metering circuitry for each outlet 10a (FIG. 1), the statistical analysis can also be used to infer which one of the AC outlets 10a of the PDU 10 is affected by the path of a residual current. In this manner it is possible to quickly detect which one of a plurality of rack assets connected to the AC outlets 10a of the PDU 10 is the faulty device giving rise to the residual current flow so that the faulty device can be quickly disconnected from the PDU. This enables the remaining, properly functioning, devices operating on the PDU 10 to continue in their operation without the need to independently power down each of the properly functioning devices coupled to the PDU in order to identify the offending device.

Figure 3:
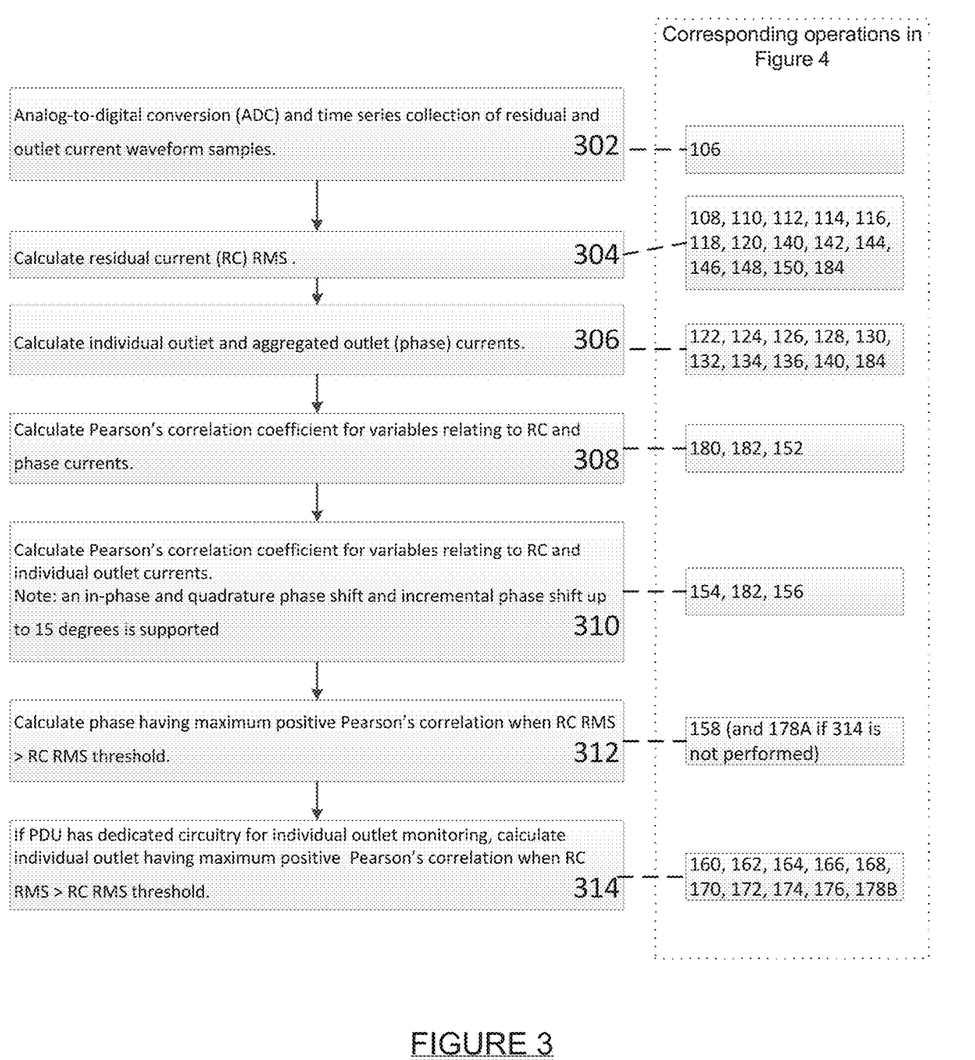
FIG. 3 is a high-level flowchart summarizing operations performed by the apparatus of FIG. 1 in detecting a residual current condition, as well as a specific voltage phase associated with the residual current condition. If the apparatus of FIG. 1 includes dedicated current metering circuitry to support measurement of current at individual AC outlets, a residual current condition at one or more AC outlets can also be detected.
Figure 4A:
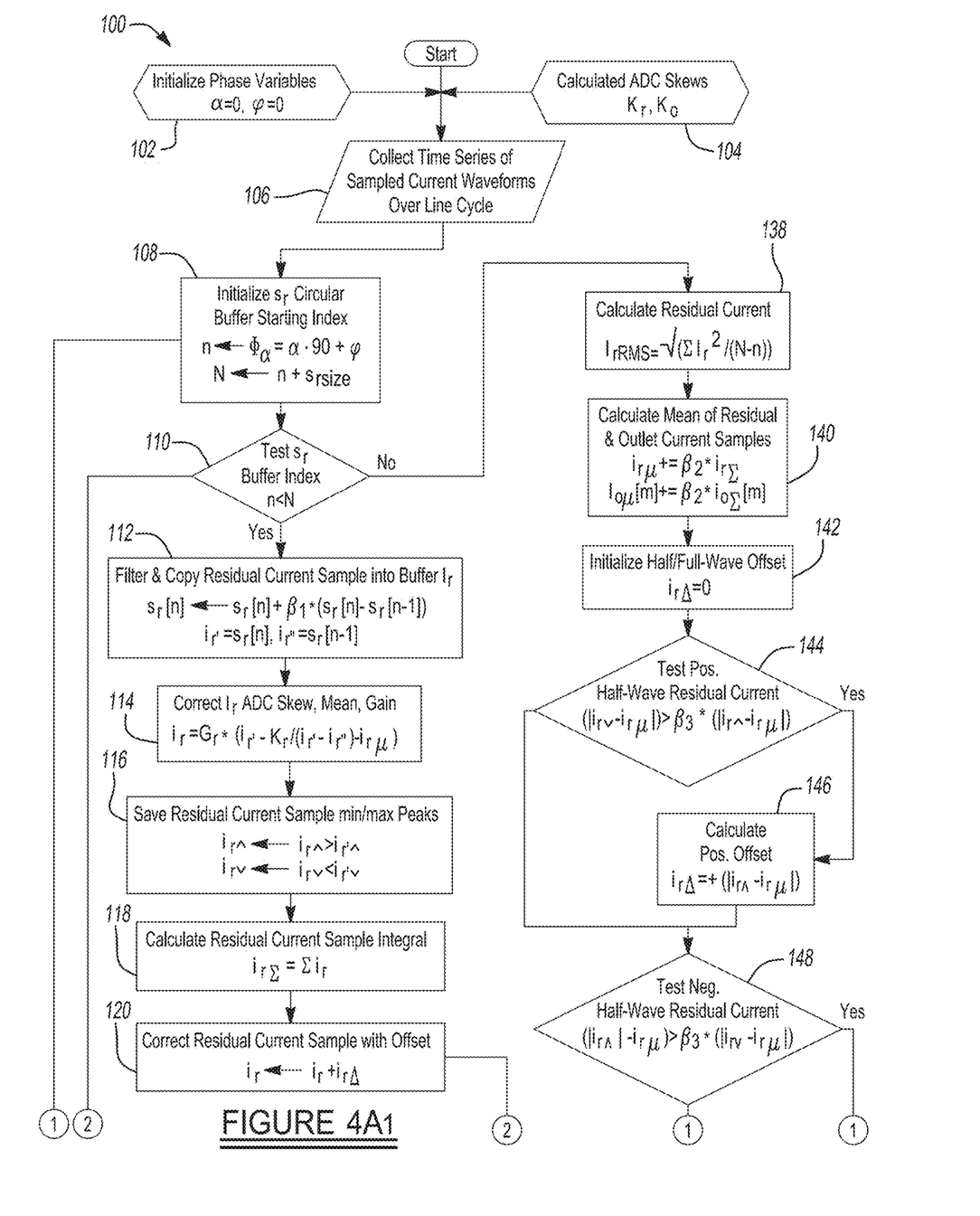

Referring to FIG. 3, a flowchart 300 is shown providing a high-level summary of the operations that may be performed by the PDU 10 in carrying out the detection of a residual current associated with any voltage phase of the AC input voltage and with any AC outlet 10a of the PDU 10. FIG. 3 also provides a list of the discrete operations that may be performed to carry out each of the high-level operations, to be discussed below with reference to FIG. 4. It should be noted that operations illustrated in the flowchart 300 may be performed by the microcontroller 32 of the RPDUC 30 of the PDU 10, but for convenience it will be stated hereinafter that an operation may be performed by the PDU 10 or by the microcontroller 32.

As an overview of the various operations shown in FIG. 3, it will be understood that the PDU 10 detects the voltage phase in which the residual current path is flowing. If the PDU 10 supports individual current measurements at the outlets, then the PDU 10 also detects the AC outlet 10a through which the residual current path is flowing. The PDU 10 accomplishes this by using statistical time series analysis along with a Pearson's correlation coefficient calculation to measure the linear dependence between the discretely sampled residual current waveform for each phase and the aggregation of the AC outlets' 10a discretely sampled current waveforms calculated per phase, in turn. The per-phase aggregation may result from current measurements by a single sensor dedicated to a set of same-phased outlets or by a plurality of sensors per each outlet. The Pearson's correlation coefficient is the covariance of the compared values divided by the product of their standard deviations. A residual current as low as 1 mA can be accurately measured/ detected along with its associated voltage phase source. From this information it can be reliably determined which AC outlet 10a the residual current is flowing out of. The presence of a residual current is constantly measured and monitored for in real-time. When a residual current threshold level is exceeded, an audible alarm may be sounded, an event notification may be delivered, and a visual indicator of the associated phase may be flashed on the phase LED 55a-55c and/or on the LED corresponding to an outlet of the intelligent power strip, if the PDU 10 is equipped with dedicated current metering circuitry per outlet, until the residual current path is eliminated or the alarm threshold is increased.

Referring further to FIG. 3, the methodology employed by the PDU 10 may begin at operation 302, with analog-to-digital conversion (ADC) and time series collection of residual and outlet current waveform samples. This is accomplished by means of discrete operation 106, to be discussed below. At operation 304, the root mean square (RMS) value of the residual current may be calculated, by means of discrete operations 108, 110, 112, 114, 116, 118, 120, 140, 142, 144, 146, 148, 150, and 184. At operation 306, the currents of individual outlets and aggregated outlet (phase) currents may be calculated. This may be accomplished by means of discrete operations 122, 124, 126, 128, 130, 132, 134, 136, 140, and 184. At operation 308, discrete operations 180, 182, and 152 may be performed in order to calculate Pearson's correlation coefficients of the variables relating to residual and phase currents. At operation 310, Pearson's correlation coefficient may be calculated of the variables relating to RC and individual outlet currents by means of discrete operations 154, 182, and 156. It should be noted that operation 310 supports both in-phase and quadrature phase shift and incremental phase shift up to 15 degrees. At operation 312, the phase having the maximum positive Pearson's correlation is calculated when the RC RMS exceeds the RC RMS threshold; this is accomplished by discrete operation 158. If the PDU 10 is equipped with dedicated current metering circuitry for each outlet 10a, operation 314 may be performed to determine the outlet having the maximum positive Pearson's correlation when the RC RMS exceeds the RC RMS threshold. This is accomplished by the sequence of discrete operations 160, 162, 163, 164, 166, 168, 170, 172, 174, 176, and 178.

Referring to FIG. 4A, a flowchart 100 is shown illustrating various discrete operations that may be performed by the PDU 10 in carrying out the detection of a residual current associated with any voltage phase of the AC input voltage and with any voltage phase related to the AC outlets 10a of the PDU 10. It should be noted that operations illustrated in the flowchart 100 may be performed by the microcontroller 32 of the RPDUC 30 of the PDU 10, but for convenience it will be stated hereinafter that an operation may be performed by the PDU 10 or by the microcontroller 32.

Referring further to FIG. 4A, the methodology employed by the PDU 10 may begin at operation 102 where phase analysis variables α (quadrature phase) and φ (incremental phase) are initialized to zero, and at operation 104 the ADC skews $K_r$ and $K_o$ may be pre-calculated. The quadrature phase may alternately be assigned 0° and 90° in later operations. The incremental phase φ has a unit magnitude dependent upon the number of equispaced ADC samples captured per line cycle (e.g., if 64 samples are captured per line cycle, then a unit of incremental phase equals 360°/64 or approximately 5.6 degrees). The ADC skews $K_r$ (for the residual current ADC channel) and $K_o$ (for each outlet current channel) are pre-calculated time delays, representing the delta time between successive samples captured one after another; if each sample duration is approximately n microseconds, with m outlet currents the last sample is captured after (m−1)*n μsec. The skew adjustment uses a linear extrapolation to estimate an extrapolated normalized current waveform sample, as if all m outlet currents were sampled simultaneously by microcontroller 32. At operation 106 a time series of sampled current waveforms received over an AC power line cycle may be collected.

At operation 108 the starting index n of the $s_r$ circular buffer 32a1 for RCM current waveform samples is initialized in accordance with Equation 1 below.

$$n \leftarrow \phi_a = \alpha*90 + \varphi$$

$$N \leftarrow n + s_{rsize} \quad \text{Equation 1}$$

At operation 110 a test may then be conducted on the $s_r$ buffer index (n<N) to determine when the time series has been completely processed. If the test produces a "Yes" answer, then at operation 112 the residual current sample is filtered by its exponentially weighted moving average and copied into buffer $i_r$ in accordance with Equation 2 below. The value of $\beta_1$ (in this example, 0.05) is dependent upon sample rate (in this example, the controller samples 64 times per line cycle) and provides acceptable smoothing characteristics for 1 ma precision while remaining responsive to changing conditions.

$$s_r[n] \leftarrow s_r[n] + \beta_1*(s_r[n] - s_r[n-1])$$

$$i_{r'} = s_r[n], i_{r''} = s_r[n-1] \quad \text{Equation 2}$$

At operation 114, corrections to remove electronic and signal offsets and apply calibrated scalars determined at manufacturing time are then calculated for $I_r$, ADC skew, mean and gain, as indicated by Equation 3 below.

$$i_r = G_r*(i_{r'} - K_r/(i_{r'} - i_{r''}) - i_{r\mu}) \quad \text{Equation 3}$$

At operation 116, the residual current sample minimum/maximum peaks may be determined, as indicated by Equation 4 below. These may be saved in order to later determine the half-wave symmetry of the current waveform (i.e., full-wave or half-wave characteristic).

$$i_{r\wedge} \leftarrow i_{r\wedge} > i_{r'\wedge}$$

$$i_{r\vee} \leftarrow i_{r\vee} > i_{r'\vee} \quad \text{Equation 4}$$

At operation 118, the microcontroller 32 may then calculate the residual current sample integral in accordance with Equation 5 below. Because a zero-valued integral is expected over a line cycle of a half-wave symmetrical periodic waveform, operation 118 enables precise correction of creeping offset errors due to small measurement imprecision.

$$i_{r\Sigma} = \Sigma i_r \quad \text{Equation 5}$$

At operation 120 the residual current sample may be corrected with an offset depending upon its detected full-wave or half-wave characteristic, in accordance with Equation 6 below. If full-wave, no gross offset adjustment occurs at operation 120. If half-wave, then a gross offset adjustment is made to reposition the flat baseline of the residual current waveform at the mathematical zero offset position so that a true RMS calculation can be made.

$$I_r \leftarrow i_r + i_{r\Delta} \quad \text{Equation 6}$$

At operation 122, the microcontroller 32 may initialize the starting index (m=0) of $i_o$ buffers for outlet current waveform samples, where M is the number of current sensors related to AC outlets 10a. If the PDU 10 supports individual outlet monitoring, then M=number of AC outlets (i.e., number of AC outlets 10a in FIG. 1). If the PDU 10 does not support individual outlet monitoring, then only a single current sensor per set or bank of outlets is available, and M=number of banks of outlets per phase.

At operation 124 the microcontroller 32 may then test the $i_o$ buffer index (m<M) to check if another AC outlet current sample needs to be processed. If this test produces a "Yes" answer, then operation 126 is performed, where the AC outlet current sample is filtered and copied into the buffer $i_o$ in accordance with Equation 7 below.

$$s_o[n] \leftarrow s_o[n] + \beta_1*(s_o[n] - s_o[n-1])$$

$$i_{o'} = s_o[n], i_{o''} = s_o[n-1] \quad \text{Equation 7}$$

At operation 128, the microcontroller 32 may then correct for $i_o[m]$ ADC skew, mean and gain in accordance with Equation 8 below.

$$I_o[m] = G_o*(i_{o'} - K_o[m]/(i_{o'} - i_{o''}) - i_{o\mu}[m]) \quad \text{Equation 8}$$

At operation 130 the microcontroller 32 may then calculate phase currents ($I_{L1}$, $I_{L2}$, and $I_{L3}$ in this example) for each phase of the AC input (phases L1, L2, and L3 in this example) by aggregating each of the same-phased M outlet current waveform samples. This operation is performed in accordance with Equation 9 as shown below.

$$I_{L1} = \Sigma i_o[m] \forall m \in L1$$

$$I_{L2} = \Sigma i_o[m] \forall m \in L2$$

$$I_{L3} = \Sigma i_o[m] \forall m \in L3 \qquad \text{Equation 9}$$

At operation 132, the microcontroller 32 may then calculate the outlet current sample integral in accordance with Equation 10 below. Because a zero-valued integral is expected over a line cycle of a half-wave symmetrical, periodic waveform, this operation enables precise correction of creeping offset errors due to small measurement imprecision.

$$i_{o\Sigma}[m] = \Sigma i_o[m] \qquad \text{Equation 10}$$

At operation 134 the microcontroller 32 may then calculate the Pearson's terms for the outlet current sample using the corrected residual current values from operation 120. This operation is performed in accordance with Equation 11 below:

$$\Sigma I_r * I_o[m], \Sigma i_o^2[m] \qquad \text{Equation 11}$$

At operation 136 the outlet index is incremented (m←m+1), and operations from 124 may then be re-performed.

Figure 4A:
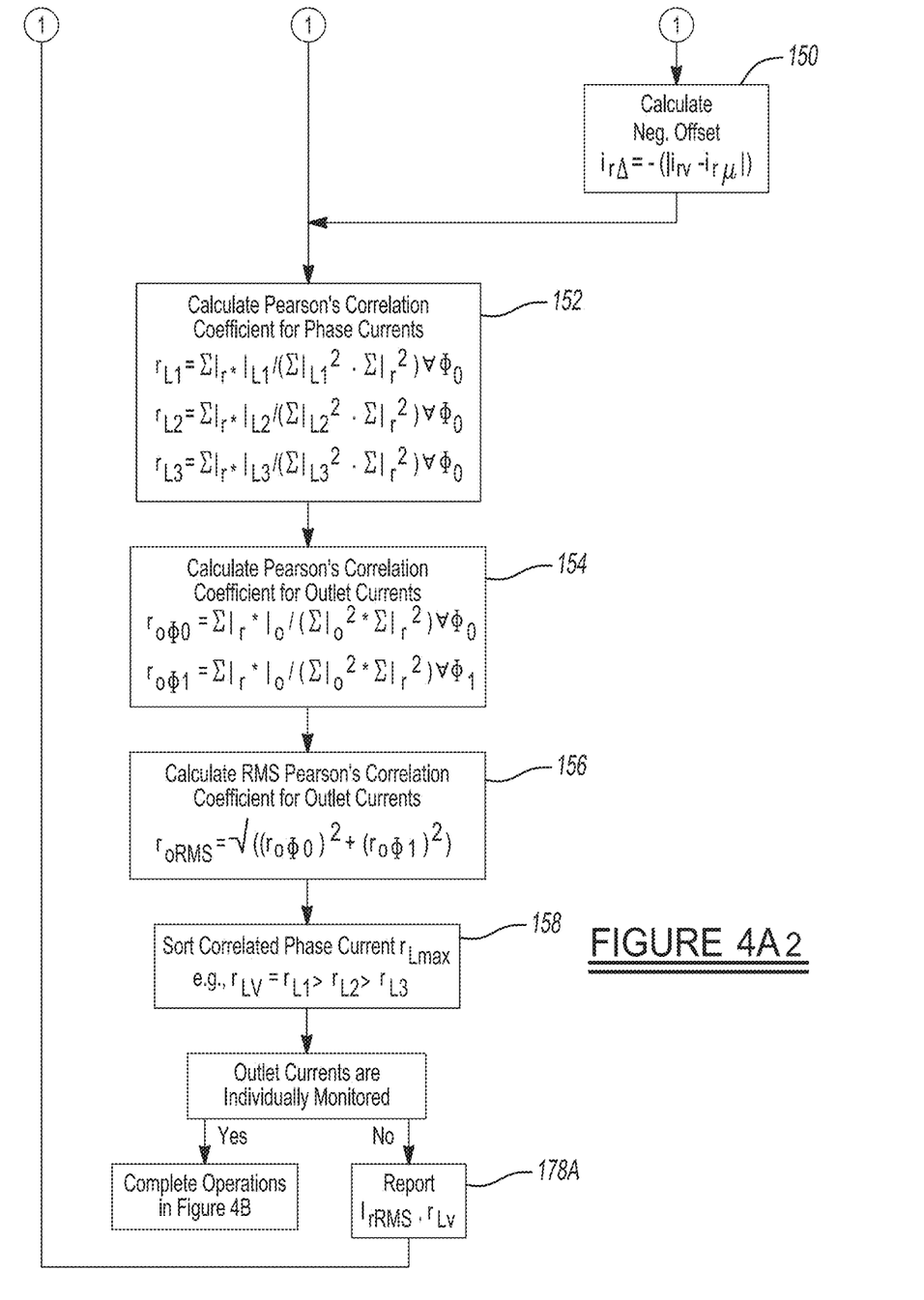

If the $i_o$ buffer index test at operation 124 produces a "No" answer, this means that all output current samples have been processed and the microcontroller 32 may then execute operation 180, in which the microcontroller calculates the Pearson's terms for the phase current samples, in accordance with Equation 12 below.

$$\Sigma I_r * I_{L1}, \Sigma I_{L1}^2$$

$$\Sigma I_r * I_{L2}, \Sigma I_{L2}^2$$

$$\Sigma I_r * I_{L3}, \Sigma I_{L3}^2 \qquad \text{Equation 12}$$

At operation 182 the microcontroller 32 may then calculate the Pearson's term for the residual current sample ($\Sigma Ir^2$). The sample index (n←n+1) may then be incremented at operation 184, and operation 110 may be repeated, and operations from 110 may then be re-performed.

If the $s_r$ buffer index test at operation 110 (n<N) produces a "No" answer, then at operation 138 the time series has been completely processed and the microcontroller 32 may calculate the RMS residual current in accordance with Equation 13 below.

$$I_{rRMS} = \sqrt{(\Sigma Ir^2/(N-n))} \qquad \text{Equation 13}$$

The microcontroller 32 may then calculate the running mean of residual and outlet current samples from weighted sample integrals calculated in operations 118 and 132, as indicated at operation 140, in accordance with Equation 14 below.

$$i_{r\mu} += \beta_2 * i_{r\Sigma}$$

$$I_{o\mu}[m] += \beta_2 * i_{o\Sigma}[m] \qquad \text{Equation 14}$$

The microcontroller 32 may then initialize the half/full wave offset ($i_{r\Delta}=0$) as indicated at operation 142, and then perform a test of the positive half-wave residual current at operation 144 by magnitude comparison of half-wave symmetry, in accordance with Equation 15 below.

$$(|i_{r\sqrt{}} - i_{r\mu}|) > \beta_3 * (|i_{r\wedge} - i_{r\mu}|) \qquad \text{Equation 15}$$

If the test at operation 144 produces a "Yes" answer, then at operation 146 the microcontroller 32 calculates the positive offset in accordance with Equation 16 below.

$$i_{r\Delta} = +(|i_{r\wedge} - i_{r\mu}|) \qquad \text{Equation 16}$$

If the test at operation 144 produces a "No" answer or if operation 146 has been performed, then at operation 148 the microcontroller 32 tests the negative half-wave residual current in accordance with Equation 17.

$$(|i_{r\wedge}| - i_{r\mu}|) > \beta_3 * (|i_{r\sqrt{}} - i_{r\mu}|) \qquad \text{Equation 17}$$

If the test at operation 148 produces a "Yes" answer, then at operation 150 the microcontroller 32 calculates the negative offset in accordance with Equation 18 below.

$$i_{r\Delta} = (|i_{r\sqrt{}} - i_{r\mu}|) \qquad \text{Equation 18}$$

If either operation 148 produces a "No" answer or if operation 150 has been performed, then at operation 152 the microcontroller 32 calculates the Pearson's correlation coefficient for the variables related to the residual and in-phase phase currents in accordance with Equation 19 below.

$$r_{L1} = \Sigma I_r * I_{L1} / (\Sigma I_{L1}^2 * \Sigma I_r^2) \forall \phi_0$$

$$r_{L2} = \Sigma I_r * I_{L2} / (\Sigma I_{L2}^2 * \Sigma I_r^2) \forall \phi_0$$

$$r_{L3} = \Sigma I_r * I_{L3} / (\Sigma I_{L3}^2 * \Sigma I_r^2) \forall \phi_0 \qquad \text{Equation 19}$$

Figure 4A:
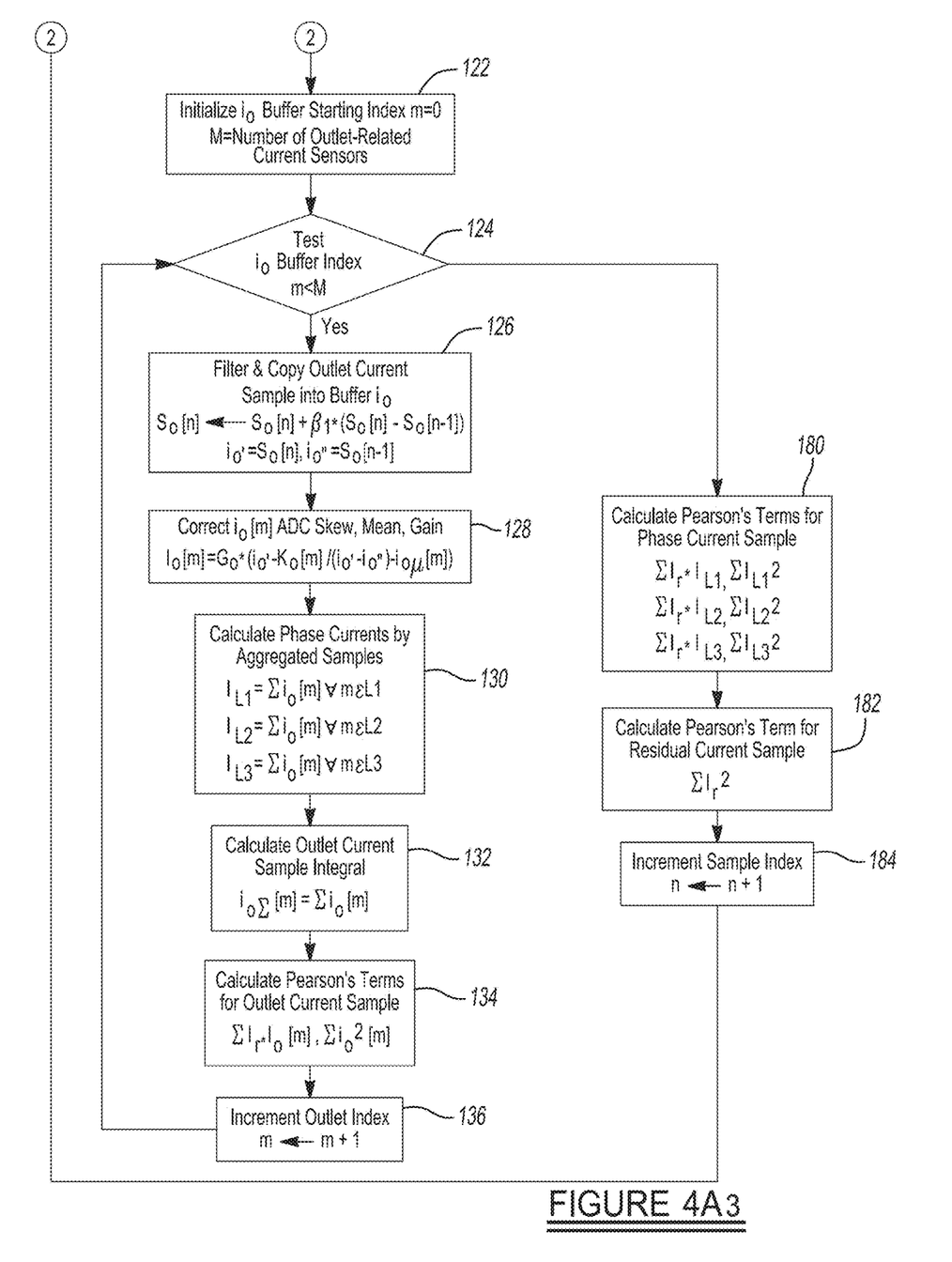

At operation 154 the microcontroller 32 calculates the Pearson's correlation coefficients for the variables related to the residual and the in-phase and quadrature phase outlet currents in accordance with Equation 20 below.

$$r_{o\phi 0} = \Sigma I_r * I_o / (\Sigma I_o^2 * \Sigma I_r^2) \forall \phi_0$$

$$r_{o\phi 1} = \Sigma I_r * I_o / (\Sigma I_o^2 * \Sigma I_r^2) \forall \phi_1 \qquad \text{Equation 20}$$

At operation 156 the microcontroller 32 calculates the RMS Pearson's correlation coefficient from results of Equation 20, in accordance with Equation 21 below.

$$r_{oRMS} = \sqrt{((r_{o\phi 0})^2 (r_{o\phi 1})^2)} \qquad \text{Equation 21}$$

At operation 158 the microcontroller 32 then sorts the Pearson's correlation coefficients for the phase currents (e.g., $r_{L\sqrt{}} = r_{L1} > r_{L2} > r_{L3}$) in order to determine the maximum positive Pearson's correlation coefficient value ($r_{Lmax}$).

If the PDU 10 does not support measurement of current at individual AC outlets, then at operation 178A, the microcontroller 32 reports the residual current RMS ($I_{rRMS}$) and the phase with maximum Pearson's correlation coefficient ($r_{L\sqrt{}}$). Operations 108 and 110 may then be repeated.

Figure 4B:
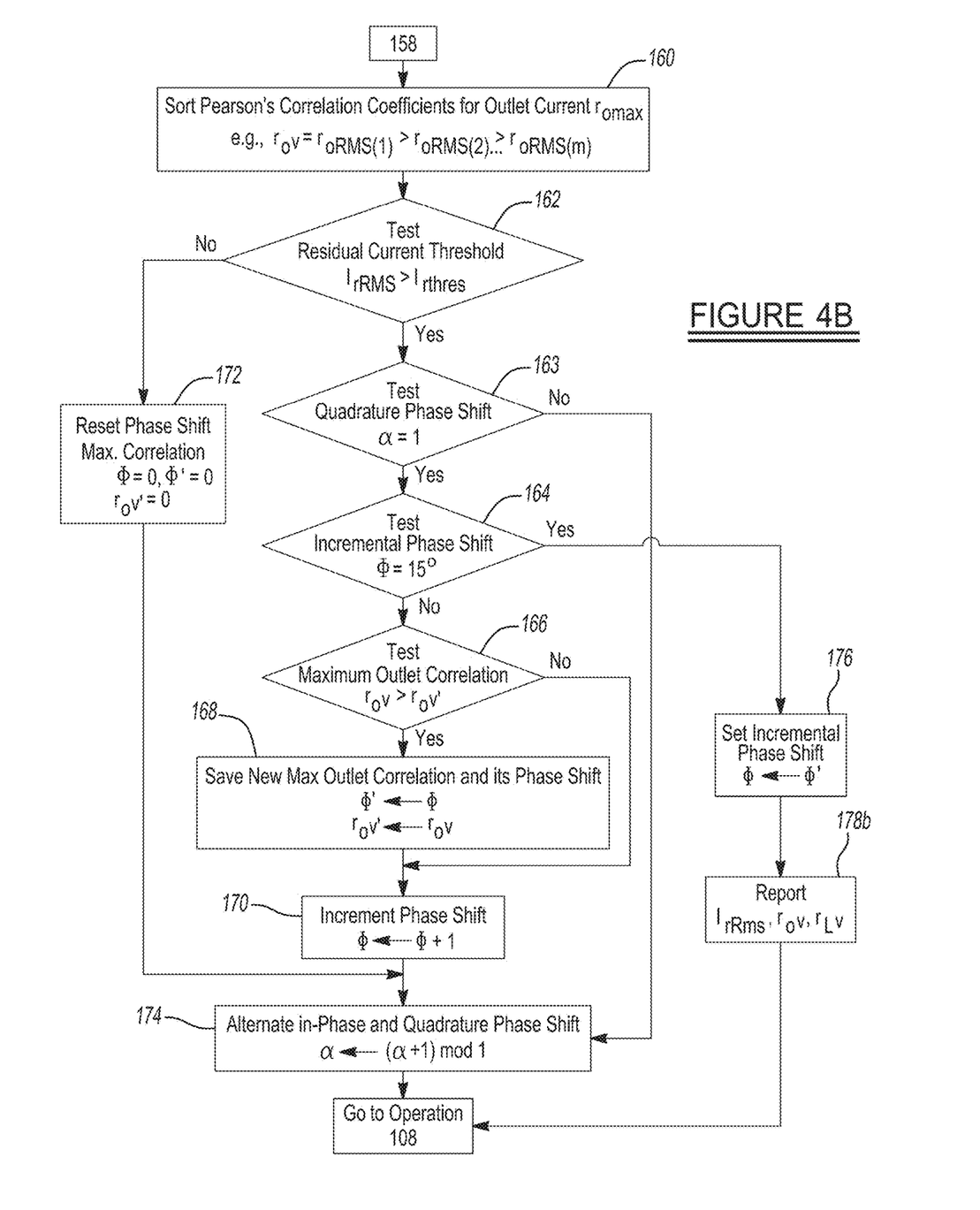
FIG. 4B shows additional operations that may be performed by the apparatus of FIG. 1 if the apparatus includes dedicated current metering circuitry to support measurement of current at individual AC outlets.

With reference to FIG. 4B, it will be understood that the sequence of operations from 160 through 178B is performed only if the PDU 10 includes dedicated current metering circuitry to support measurement of current at individual AC outlets. If this is the case, then in FIG. 4B at operation 160, the microcontroller 32 then sorts the Pearson's correlation coefficients for the outlet currents (e.g., $r_{o\sqrt{}} = r_{oRMS(1)} > r_{oRMS(2)} \cdots > r_{oRMS(m)}$) in order to determine the maximum positive Pearson's correlation coefficient value ($r_{omax}$).

At operation 162 the microcontroller 32 then performs a test of the residual current threshold ($I_{rRMS} > I_{rthres}$). If this test produces a "Yes" answer, indicating the residual current threshold has been exceeded, then at operation 163 the value of the quadrature phase variable $\alpha$ is tested ($\alpha=1$) for the presence of a quarter cycle or quadrature phase shift. If this test produces a "Yes" answer, then at then at operation 164 the microcontroller 32 tests the maximum incremental phase shift angle ($\phi$=15°) to determine if the incremental phase shift angle has reached 15°. This is done in order to evaluate the maximum Pearson's correlation coefficient over a small range, in case a resistive fault has a small parallel stray capacitance which would produce a corresponding incremental phase shift of the residual current waveform with respect to the outlet current waveform. A small power factor difference between outlet loads would result in a larger, more discriminating maximum correlation and therefore even more reliable outlet detection. If this test produces a "No" answer, then at operation 166 the microcontroller 32 tests to determine if the maximum outlet correlation ($r_{o\sqrt{}} > r_{o\sqrt{}}$) has been exceeded. If the test at operation 166 produces a "Yes" answer, then at operation 168 the microcontroller 32 saves the new maximum outlet correlation and its phase shift ($\phi' \leftarrow \phi$ and $r_{o\sqrt{}} \leftarrow r_{o\sqrt{}}$). After operation 168, or if the test at operation 166 produces a "No" answer, then at operation 170 the microcontroller 32 increments the phase shift ($\phi \leftarrow \phi+1$).

If the residual current threshold test at operation 162 produces a "No" answer, then at operation 172 the microcontroller 32 resets the phase shift maximum correlation $\phi=0$, $\phi'=0$, and $r_{o\sqrt{}}=0$). Once either of operations 170 or 172 is performed, or if the test at operation 163 produces a "No" answer, then at operation 174 the microcontroller 32 may calculate alternate in-phase and quadrature phase shifts ($\alpha \leftarrow (\alpha+1) \mod 1$). The outlet current waveforms may have non-linear sinusoidal characteristics and/or be phase shifted for reactive loads, producing a non-unity power factor. Thus, considering the in-phase and quadrature calculations in testing for maximum Pearson's correlation coefficient, a larger discriminating result is achieved. After operation 174 is performed, then operations 108 and 110 may be repeated.

If the test for maximum incremental phase shift angle at operation 164 produces a "Yes" answer, then at operation 176 the microcontroller 32 sets the incremental phase shift ($\phi \leftarrow \phi'$), and then at operation 178B reports the residual current RMS ($I_{rRMS}$), the outlet with maximum Pearson's correlation coefficient ($r_{o\sqrt{}}$), and the phase with maximum Pearson's correlation coefficient ($r_{L\sqrt{}}$). Operations 108 and 110 may then be repeated.

The PDU 10 and its method of operation as described herein do not require costly circuitry dedicated per each phase and/or outlet to directly measure residual current flow. A particularly important and useful property of the PDU 10 and its method of operation is that it is invariant to scale or magnitude of the compared values. A set of correlation values are calculated between −1 and +1, where a value closest to +1 means the linear dependence and phase matching is the highest, and therefore, the most likely path of the residual current flow. A residual current as low as 1 mA can be accurately measured and its associated voltage phase source and flow through outlet can be reliably determined.

The various embodiments of the present disclosure provide a significant advantage over prior art methods that can merely measure for a residual current condition. The Vertiv MPH2 rack PDU controller firmware, for example, may be used to support the methodology described herein.

The various embodiments and methodology of the present disclosure presents a lower cost solution when compared to directly measuring differential currents at each phase and/or outlet. The various embodiments and methodology of the present disclosure offer highly sensitive detection of small phase differences of 0.5% power factor between compared current waveforms. The methodology of the present disclosure automatically discriminates the most likely residual current path external to the unit, so the powered device causing the fault can be quickly removed to minimize down times and reduce the associated costs, rather than being required to manually identify the residual current path by a trial and error method.

The various embodiments of the PDU 10 and its method of operation further facilitate a preventative maintenance program through the ability to obtain additional indirect information about the health of insulation system(s) associated with electrical cabling being used, and thus may help prevent unanticipated downtime of all types of electrically powered devices. The PDU 10 and its method of operation, by its ability to quickly detect residual currents and identify specific AC outlets that such currents are associated with, may also provide a measure of fire protection for a facility in which the present disclosure is used.

While various embodiments have been described, those skilled in the art will recognize modifications or variations which might be made without departing from the present disclosure. The examples illustrate the various embodiments and are not intended to limit the present disclosure. Therefore, the description and claims should be interpreted liberally with only such limitation as is necessary in view of the pertinent prior art.

What is claimed is:

1. A method for use with an intelligent equipment rack power distribution unit (PDU) for detecting a residual current from a three-phase AC power source which is flowing through the PDU, to help identify a fault existing with an equipment component being powered from the PDU, wherein the PDU has a plurality of branch receptacle controllers, with each said branch receptacle controller being operably associated with one or more alternating current (AC) outlets, and wherein the AC outlets are independently coupled to a corresponding number of independent equipment components and being powered from the PDU, the method comprising:
   obtaining current sensing information;
   performing an analog-to-digital conversion (ADC) of the current sensing information to obtain ADC samples;
   obtaining a collection of the ADC samples as residual and load current waveform samples;
   using a microcontroller to perform operations including:
      calculating a residual current (RC) RMS value for the obtained residual current waveform samples;
      calculating phase current from the aggregation of the load current waveform samples having the same phase;
      calculating Pearson's correlation coefficients for variables relating to the residual current waveform samples and to the phase current;
      calculating Pearson's correlation coefficients for the variables relating to residual current waveform samples and individual load current waveform samples from each AC power outlet;
      determining phase information pertaining to the phase having a maximum positive Pearson's correlation when the residual current RMS value is greater than a predetermined residual current RMS threshold; and
      using the phase information to help identify which one of the branch receptacle controllers has an AC outlet which is coupled to a malfunctioning one of the equipment components.

2. The method of claim 1, wherein using the phase information includes determining an individual one of the AC outlets having the maximum positive Pearson's correlation when the residual current RMS value is greater than the predetermined residual current RMS threshold, to thus help identify a specific one of the AC outlets that is coupled to the malfunctioning one of the equipment components.

3. The method of claim 2, wherein calculating said residual current (RC) RMS value further comprises filtering by an exponentially weighted moving average of the residual current samples in accordance with an Equation:

$$s_r[n] \leftarrow s_r[n] + \beta_1 * (s_r[n] - s_r[n-1])$$

$$i_{r'} = s_r[n], i_{r''} = s_r[n-1],$$

where $s_r$ is the circular memory buffer; n is the buffer index, and $\beta_1$ is a value dependent upon sample rate of the residual current (RC) being sampled by the microcontroller taking a plurality of samples per AC line cycle.

4. The method of claim 1, wherein calculating residual current (RC) RMS value includes determining corrections for analog-to-digital conversion (ADC) skews for a residual current ADC channel (ADC $K_r$) and an outlet current channel (ADC $K_o$), wherein the ADC Kr and ADC Ko skews are pre-calculated time delays representing a delta time between successive samples captured one after another for each one of a residual current ADC channel and an ADC outlet current channel.

5. The method of claim 1, wherein calculating phase current from the aggregation of the load current waveform samples having the same phase includes calculating an AC outlet current sample.

6. The method of claim 1, wherein calculating residual current (RC) RMS value includes calculating a residual current sample integral to remove errors due to measurement imprecision.

7. The method of claim 6, further comprising correcting each of the obtained residual current waveform samples with an offset.

8. The method of claim 2, wherein calculating the Pearson's correlation coefficients for the variables relating to residual current waveform samples and individual current waveform samples from each outlet includes calculating the Pearson's correlation coefficients for variables related to the residual and the in-phase and quadrature phase load current samples.

9. The method of claim 8, further comprising using the microcontroller to sort the Pearson's correlation coefficients for both of the phase and individual load current samples in order to determine the maximum positive Pearson's correlation.

10. The method of claim 6, wherein calculating residual current (RC) RMS includes:
1) testing a positive half-wave residual current by magnitude comparison of half-wave symmetry, and when the test produces a positive answer, then calculating a positive offset; and
2) testing a negative half-wave residual current by magnitude comparison of half-wave symmetry and, when this test produces a positive answer, then calculating a negative offset.

11. An intelligent rack power distribution unit (PDU) having a plurality of alternating current (AC) outlets to which a plurality of equipment components, supported in an equipment rack, may be coupled to and powered by an AC input signal input to the PDU, the PDU comprising:
a microcontroller;
a plurality of branch receptacle controllers in communication with the microcontroller, each said branch receptacle controller being operably associated with one of more AC outlets of the plurality of AC outlets of the intelligent PDU;
each said branch receptacle controller further being configured to monitor current being drawn by ones of the equipment components coupled to the one or more AC outlets associated with therewith;
a plurality of buffers for storing current samples measured by the microcontroller;
a residual current monitor subsystem in communication with the microcontroller for monitoring residual current flow to AC outlets being controlled by each of the branch receptacle controllers; and
the microcontroller further being configured to use the current monitor subsystem to obtain a plurality of current waveform samples and to perform to perform an analog-to-digital (ADC) conversion of the current waveform samples to produce ADC samples, and to use calculated Pearson's correlation coefficients associated with the ADC samples to help identify which one of the branch receptacle controllers has an AC outlet coupled to a malfunctioning one of the equipment components.

12. The PDU of claim 11, wherein the obtained current waveform samples include residual current samples, and wherein the microcontroller is further configured to:
calculate a residual current (RC) RMS value for the obtained residual current samples;
calculate phase current from an aggregation of the outlet current waveform samples having the same phase; and
to calculate the Pearson's correlation coefficients for variables relating to residual current and the phase current.

13. The PDU of claim 12, wherein the microcontroller is further configured to calculate the Pearson's correlation coefficients for each one of the outlet current waveforms; and
to determine the phase having a maximum positive Pearson's correlation when the residual current RMS value is greater than a predetermined residual current RMS threshold.

14. An intelligent rack power distribution unit (PDU) having a plurality of alternating current (AC) outlets to which a plurality of equipment components, supported in an equipment rack, may be coupled to and powered by an AC input signal input to the PDU, the intelligent PDU comprising:
a microcontroller;
a plurality of branch receptacle controllers in communication with the microcontroller, each said branch receptacle controller being operably associated with one of more AC outlets of the plurality of AC outlets of the intelligent PDU;
each said branch receptacle controller further being configured to monitor current being drawn by ones of the equipment components coupled to the one or more AC outlets associated with therewith;
a circular buffer for storing measured residual current samples measured by the microcontroller;
an outlet current buffer for storing outlet current samples measured by the microcontroller;
a residual current monitor subsystem for monitoring residual current flow;
the microcontroller further being configured to:
use the residual current monitor subsystem to perform an analog-to-digital (ADC) conversion of the residual current samples and the outlet current samples to obtain ADC samples of the residual current samples and the outlet current samples;

manage a time series collection of the ADC samples as residual and outlet current waveform samples, and saving the residual current waveform samples in the circular buffer, and saving the outlet current waveform samples in the outlet current buffer;

calculate a residual current (RC) RMS value for the obtained residual current samples;

calculate phase current from an aggregation of the outlet current waveform samples having the same phase;

calculate Pearson's correlation coefficients for variables relating to residual current and the phase current, and using the calculated Pearson's coefficients to help determine which one of a plurality of the branch receptacle controllers has an associated one or more of the equipment components which are malfunctioning.

15. The intelligent PDU of claim 14, wherein the microcontroller:

further obtains Pearson's coefficients for variables relating to an individual outlet current of each said AC outlet associated with each said branch receptacle controller;

determines the phase having a maximum positive Pearson's correlation when the residual current RMS value is greater than a predetermined residual current RMS threshold; and determines an individual one of the AC power outlets having the maximum positive Pearson's correlation when the residual current RMS value is greater than the predetermined RC RMS threshold, to further help determine which specific one of two or more of said AC outlets associated with a given one of the branch receptacle controllers is connected to a malfunctioning equipment component.

16. The intelligent PDU of claim 14, wherein in calculating each one of said residual current (RC) RMS values, the microcontroller is configured to filter, by an exponentially weighted moving average, the residual current (RC) RMS value.

* * * * *